(12) United States Patent
Onizawa et al.

(10) Patent No.: US 8,669,185 B2
(45) Date of Patent: Mar. 11, 2014

(54) METHOD OF TAILORING CONFORMALITY OF SI-CONTAINING FILM

(75) Inventors: Shigeyuki Onizawa, Tama (JP); Woo-Jin Lee, Tama (JP); Hideaki Fukuda, Hachioji (JP); Kunitoshi Namba, Machida (JP)

(73) Assignee: ASM Japan K.K., Tokyo (JP)

( * ) Notice: Subject to any disclaimer, the term of this patent is extended or adjusted under 35 U.S.C. 154(b) by 443 days.

(21) Appl. No.: 12/847,848

(22) Filed: Jul. 30, 2010

(65) Prior Publication Data
US 2012/0028469 A1 Feb. 2, 2012

(51) Int. Cl.
H01L 21/311 (2006.01)
H01L 21/302 (2006.01)
H01L 21/31 (2006.01)
C23C 16/00 (2006.01)

(52) U.S. Cl.
USPC ............ 438/694; 427/255.28; 427/255.394; 427/255.7; 438/703; 438/724; 438/791; 438/792

(58) Field of Classification Search
USPC ........... 427/255.28, 255.394, 255.7; 438/694, 438/702, 724, 775–777, 791–792
See application file for complete search history.

(56) References Cited

U.S. PATENT DOCUMENTS

| | | | |
|---|---|---|---|
| 4,579,623 A * | 4/1986 | Suzuki et al. .................... 438/7 |
| 4,985,114 A | 1/1991 | Okudaira | |
| 6,784,108 B1 * | 8/2004 | Donohoe et al. ............. 438/706 |
| 7,381,644 B1 * | 6/2008 | Subramonium et al. ...... 438/671 |
| 7,919,416 B2 * | 4/2011 | Lee et al. ...................... 438/792 |
| 7,972,980 B2 * | 7/2011 | Lee et al. ...................... 438/792 |
| 8,142,862 B2 * | 3/2012 | Lee et al. ...................... 427/585 |
| 8,173,554 B2 * | 5/2012 | Lee et al. ...................... 438/792 |
| 2007/0232071 A1 * | 10/2007 | Balseanu et al. ............. 438/694 |
| 2010/0124618 A1 * | 5/2010 | Kobayashi et al. ........... 427/535 |

* cited by examiner

Primary Examiner — Allan Olsen
Assistant Examiner — Margaret D Klunk
(74) Attorney, Agent, or Firm — Snell & Wilmer L.L.P.

(57) ABSTRACT

A method of tailoring conformality of a film deposited on a patterned surface includes: (I) depositing a film by PEALD or pulsed PECVD on the patterned surface; (II) etching the film, wherein the etching is conducted in a pulse or pulses, wherein a ratio of an etching rate of the film on a top surface and that of the film on side walls of the patterns is controlled as a function of the etching pulse duration and the number of etching pulses to increase a conformality of the film; and (III) repeating (I) and (II) to satisfy a target film thickness.

14 Claims, 3 Drawing Sheets

METHOD OF TAILORING CONFORMALITY OF SI-CONTAINING FILM

BACKGROUND OF THE INVENTION

1. Field of the Invention

The present invention generally relates to pulsed plasma enhanced chemical vapor deposition (PPECVD) and plasma enhanced atomic layer deposition (PEALD) for depositing conformality-tailored films.

2. Description of the Related Art

PPECVD/PEALD processes can provide high conformality (also referred to as "coverage") of films depositing on a patterned surface on which multiple recesses or grooves are formed in patterns for establishing interconnects, as compared with plasma enhanced chemical vapor deposition (PECVD) processes. However, PEALD processes are typically not as good as thermal ALD in terms of conformality, although PEALD processes are typically better than thermal ALD in terms of deposition rates and controllability, depending on the type of films.

High conformality refers to a high ratio of a thickness of film deposited on a side wall of a recess to a thickness of film deposited on a top surface of the recess. The conformality changes largely depending on the aspect ratio or width of a recess, even if the same processes are used. Recently, since it has been required for semiconductor devices to have more compact and fine structures, when the aspect ratio is 2 to 10 or the width of a recess is 100 nm to 15 nm, in conventional PEALD, the conformality of films may be typically in the range of 50% to 60%, i.e., the thickness of film on the top is approximately twice the thickness of film on the side.

A typical conventional sequence of deposition gas flow and RF power discharge is shown in FIG. 1. In FIG. 1, a deposition gas is introduced in pulses, and a time period between the beginning of a pulse of the deposition gas flow and the beginning of a next pulse of the deposition gas flow constitutes one cycle. RF power is applied also in pulses after the pulse of the deposition gas flow but before the next pulse of the deposition gas flow, so that deposition gas adsorbed on the surface of a substrate is fixed on the surface by plasma. Although not shown in this figure, a reactant gas and a rare gas flow continuously without interruption, and a period between the pulses of the deposition gas is considered to be a purge step. FIG. 2 shows another typical conventional sequence of deposition gas flow and RF power discharge. In this figure, RF power is applied continuously without interruption, while introducing the deposition gas in pulses. By applying RF power continuously, a film such as a Si—N bond-containing film, which has poor adhesion to the substrate surface, can deposit and accumulate on the substrate surface. Also omitted in this figure, reactant gas flow and rare gas flow are continuously conducted.

Normally, the cycle is repeated several tens of times to several hundred times to form a target layer on a patterned surface. As described above, in PEALD for high aspect ratios and/or narrow recesses, the conformality of the resultant film is conventionally typically in the rage of 50% to 60%.

Any discussion of the background art which has been included in the present disclosure is solely for the purpose of providing a context for the present invention, and it should not be taken as an admission that any or all of the discussion form part of the prior art or were known in the art at the time the invention was made.

SUMMARY OF THE INVENTION

Consequently, in an aspect, an embodiment of the present invention provides a method of tailoring conformality of a film deposited on a patterned surface, by combining depositing a film by PEALD or pulsed PECVD on the patterned surface and etching the film, wherein the deposition and the etching are separately controlled, wherein the deposition pulse duration and the number of deposition cycles, the etching pulse duration and the number of etching cycles, and the number of cycles of repeating a set of the deposition session and the etching session can be controlled independently of each other, thereby adjusting the deposition rates on a top surface and on side walls of the patterns and adjusting the etching rates on the top surface and the side walls of the patterns so as to form a target film having a target conformality on the patterned surface.

In some embodiments, the greater the thickness of the film on the top surface as compared with that of the film on the side walls, the higher the number of etching cycles is used, provided that the total etching duration is the same. In some embodiments, if the total etching duration is the same, the higher the number of etching cycles, the more reduced the thickness of the film on the top surface as compared with that of the film on the side walls becomes. That is, the top/side etching ratio is etching duration dependent. By repeating etching with suitable duration, the conformality of the film can be tailored as desired. The etching can be in situ plasma etching (etching gas is excited in the reactor) or remote plasma etching (etching gas is excited in a remote plasma unit). In some embodiments, deposition and etching are conducted in the same reactor, and alternatively, etching is conducted in a reactor different from that for deposition. In the above, etching is used not for completely removing a layer, but for controlling the top/side thickness ratio of the film. Thus, when the top/side thickness ratio of the film reaches a target or desired value, etching is terminated so as to inhibit unnecessarily reducing the thickness of the film. In other words, etching is used for depositing a film with high conformality. In some embodiments, etching is anisotropic.

In some embodiments, the film is a silicon nitride film for which it is typically difficult to control its conformality even if applied RF power is pulsed. In some embodiments, a combination of pulsed deposition and pulsed etching is used for forming a film, and further a set of pulsed deposition and pulsed etching is repeated until the target or desired thickness with the target or desired top/side thickness ratio is obtained.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

As described above, in order to form a film with high conformality, pulsed deposition and pulsed etching are typically combined and controlled independently.

In this disclosure, "gas" may include vaporized solid and/or liquid and may be constituted by a mixture of gases. In this disclosure, "having Si—N bonds" may refer to being characterized by Si—N bonds, being constituted mainly or predominantly by Si—N bonds, being categorized in Si—N films, and/or having a main skeleton substantially constituted by Si—N bonds. In this disclosure, the reactive gas, the additive gas, and the hydrogen-containing silicon precursor may be different from each other or mutually exclusive in terms of gas types, i.e., there is no overlap of gases among these categories. Further, in this disclosure, any ranges indicated may include or exclude the endpoints.

Figure 5:
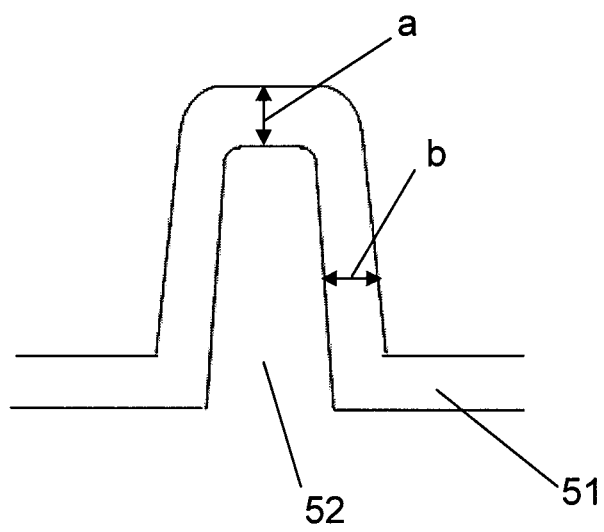
FIG. 5 is a schematic cross section of a partially fabricated patterned substrate according to an embodiment of the present invention, showing the thickness of the film on the top surface and the side walls.

In this disclosure, "conformality" or "step coverage" of a film may be defined as the ratio percent of the average thickness of the film deposited on the sidewalls of a recess or trench of a pattern formed on a substrate surface to the average thickness of the film on the top surface of the pattern. FIG. 5 illustrates an embodiment showing a cross section of a pattern of a substrate. A protrusion 52 (a wall of a recess or trench) is covered with a film 51. The thickness of the film on the top surface is "a", and the thickness of the film on a side wall is "b" nearly at a halfway point of the protrusion 52. The conformality of the film 51 is defined as "b/a".

The disclosed embodiments include a method of forming a Si-containing film on a patterned surface of a substrate, comprising: (i) depositing a Si-containing sub-layer on the patterned surface by pulsed plasma enhanced chemical vapor deposition (PPECVD) or plasma enhanced atomic layer deposition (PEALD), wherein a thickness of the sub-layer is T1 at a top surface of the patterned surface, referred to as top thickness, and S1 at a side wall of the patterned surface, referred to as side thickness, wherein S1/T1 is less than one; (ii) etching the sub-layer by reducing T1 more than S1 to obtain a second top thickness T2 and a second side thickness S2, wherein S2/T2 is closer to one than is S1/T1; and (iii) repeating steps (i) and (ii) multiple times to increase the top thickness and the side thickness, thereby forming a Si-containing film composed of laminated multiple sub-layers on the patterned surface.

In some embodiments, the etching is conducted in pulses by exposing the sub-layer to an excited etching gas in pulses. The excited etching gas is produced by a remote plasma unit and introduced into a reaction chamber in pulses where the substrate is placed. Alternatively, the excited etching gas is produced by applying RF power to an etching gas introduced into a reaction chamber in pulses where the substrate is placed. Further, in some embodiments, any other suitable energy source or sources can be used for exciting etching gas.

In some embodiments, S1/T1 is no more than 0.8 (e.g., 0.5 to 0.7, or 0.6 to 0.8), and S2/T2 is more than 0.9 (e.g., 0.9 to 1.1, or 0.95 to 1.0). In some embodiments, S1/T1 is less than 0.9, and S2/T2 is no less than 0.95. In some embodiments, S1/T1 is more than 0.8 (e.g., 0.85 to 0.9, or 0.9 to 0.94), and S2/T2 is no less than 0.95.

In some embodiments, steps (i) and (ii) are conducted in the same reaction chamber. Alternatively, steps (i) and (ii) are conducted in different reaction chambers.

In some embodiments, Si-containing film is a SiN film or SiCN film.

The disclosed embodiments further include a method of tailoring conformality of a Si-containing film deposited by pulsed plasma enhanced chemical vapor deposition (PPECVD) or plasma enhanced atomic layer deposition (PEALD), comprising: (I) setting a target conformality, S/T, of a target film deposited on a patterned surface of a substrate, where S denotes a thickness of the target film at a side wall of the patterned surface, and T denotes a thickness of the target film at a top surface of the patterned surface; (II) introducing a Si-containing deposition gas in pulses into a reaction area during a first period where the substrate with the patterned surface is placed, wherein a pulse of introducing the deposition gas is repeated multiple times, while no etching gas is introduced into the reaction area during the first period; (III) applying RF power to the reaction area at least when the deposition gas is not introduced during the first period, thereby depositing a film on the patterned surface of the substrate, wherein a thickness of the film is T1 at a top surface of the patterned surface and Si at a side wall of the patterned surface; (N) discontinuing the introduction of the deposition gas and the application of RF power and exposing the film to excited etching gas during a second period, wherein no Si-containing deposition gas is introduced during the second period, thereby reducing the thickness of the film to T2 at the top surface of the patterned surface and S2 at the side wall of the patterned surface, wherein S2/T2 is closer to 1 than is S1/T1; and (V) if S2/T2 is not satisfactorily close to S/T, pulsing the exposure of the excited etching gas to the film, shortening a time period of each pulse, and increasing the number of pulses relative to those in the immediately previous step (IV), followed by conducting steps (II) to (N).

In some embodiments, the exposure of the excited etching gas to the film is conducted in pulses during the second period.

In some embodiments, S2/T2 is satisfactorily close to S/T in step (N), and the method further comprises repeating steps (II) to (N) as a cycle until the target film is obtained.

In some embodiments, in step (IV), the excited etching gas is created by introducing an etching gas into the reaction area and applying RF power thereto. Alternatively, in step (IV), the excited etching gas is introduced into the reaction area from a remote plasma unit.

In some embodiments, the target film contains Si—N bonds.

In some embodiments, in step (II), a reactant gas and a rare gas are continuously introduced without interruption into the reaction area during the first period.

In some embodiments, in step (IV), a rare gas is continuously introduced without interruption into the reaction area.

In some embodiments, steps (II) and (IV) are conducted in the same reaction chamber.

In some embodiments, steps (II) and (III) and step (IV) are conducted in different reaction chambers.

Some embodiments will be explained with respect to drawings. However, the present invention is not intended to be limited to the drawings.

Figure 1:
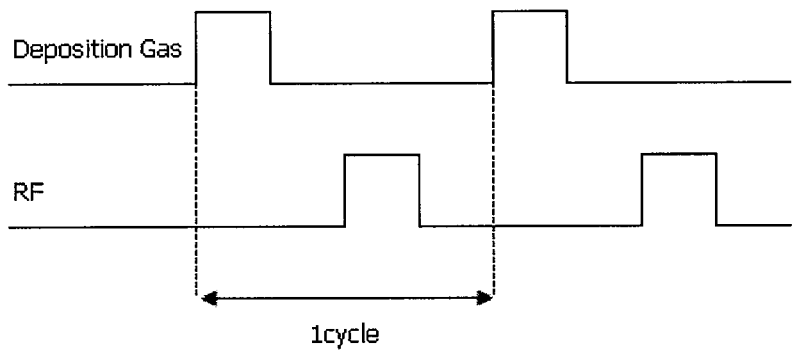
FIG. 1 shows a conventional pulsed deposition process sequence.
Figure 2:
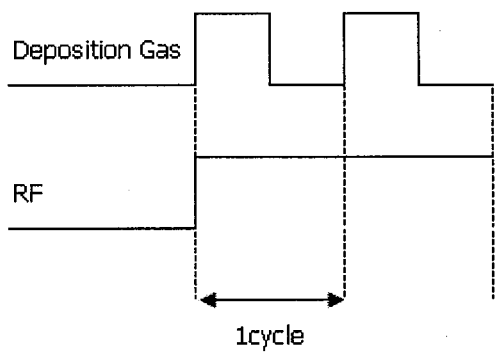
FIG. 2 shows another conventional pulsed deposition process sequence.
Figure 3:
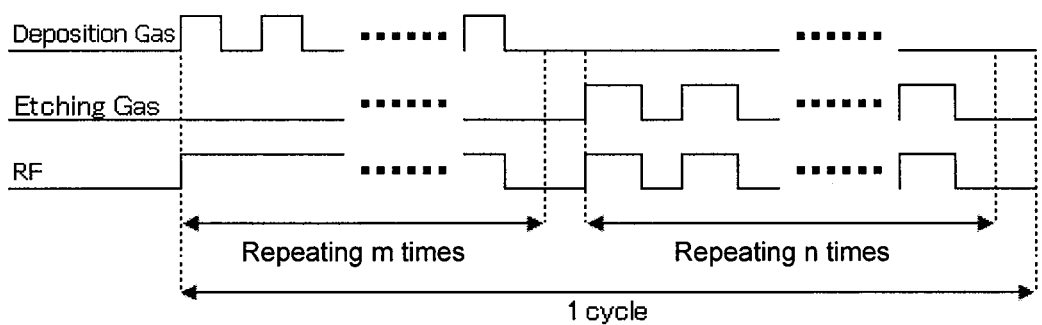
FIG. 3 shows a pulsed deposition sequence according to an embodiment of the present invention wherein in situ plasma etching is conducted.

FIG. 3 shows a pulsed deposition sequence according to an embodiment using in situ plasma etching. This figure illustrates a single pattern of deposition gas pulses. However, if the deposition gas is comprised of multiple gases such as trisilyamine and hexane, the multiple gases can be introduced in the same pulses as illustrated in FIG. 3, or alternatively, the multiple gases can be introduced sequentially in multiple pulses. In this figure, the pulse of deposition gas is repeated m times, i.e., m cycles of deposition gas are conducted, during one deposition session (one cycle of the pulse is defined in the same manner as in FIG. 2). The number m may be an integer of 30 to 20, typically 70 to 100 in some embodiments (e.g., the thickness of the film on the top surface may be in a range of 5 to 30 nm, typically 10 to 15 nm). During the deposition session, no etching gas is introduced into the reaction chamber. RF power is kept ON during the deposition session. Alternatively, RF power can be applied also in pulses as shown in FIG. 1. In this figure, a reactive gas flow and a rare gas flow are omitted, but they may be used and continuously introduced while the deposition gas is introduced in pulses. Thus, a period between two adjacent pulses of deposition gas serves as a purging step.

In some embodiments, the deposition gas may include at least one silicon-containing gas selected from the group consisting of a gas containing silicon such as silane, disilane, trisilylamine, and bis(tert-butylamino)silane. Further, the deposition gas may further include a hydrocarbon gas such as hexane and any other suitable gas for deposition. In some embodiments, RF power has a frequency exceeding 5 MHz. For example, a high RF frequency power of 13.56 MHz, 27 MHz, or 60 MHz can be used. In some embodiments a high RF frequency power can be combined with a low RF power of 5 MHz or less. In some embodiments the ratio of low-frequency power to high-frequency power may be 0 to about 50% or less. In some embodiments the ratio of low-frequency power to high-frequency power is 0 to about 30% or less. In some embodiments, the RF power may be applied in the range of approximately 0.02 W/cm$^2$ to approximately 2 W/cm$^2$ per area of the substrate (e.g., a range of 0.03-0.1 W/cm$^2$, a range of 0.05-0.5 W/cm$^2$, and a range of 0.5-2 W/cm$^2$) and the reaction space pressure may be adjusted in the range of approximately 0.1 Torr to approximately 10 Torr. In some embodiments the pressure in the reaction space may be approximately 2 Torr to 9 Torr. For better conformality of a film, the RF power may be controlled at a low level.

In some embodiments, the substrate may be kept at a temperature of 0° C. to 400° C. while the film is deposited thereon. In some embodiments the substrate temperature is about 250° C. to about 350° C. during deposition.

In some embodiments, the deposition gas may be introduced in pulses of a duration of approximately 0.1 sec to 1.0 sec. In some embodiments, the pulses of the deposition gas are of a duration of about 0.2 sec to about 0.3 sec. In some embodiments, the pulses of the deposition gas are separated by intervals (purging) of approximately 0.1 sec to 3.0 sec. In some embodiments the intervals are about 0.5 sec to about 3.0 sec or 1.0 sec to about 2.0 sec. In an embodiment, the pulse duration may be equal to or shorter than the interval.

In some embodiments, the reactive gas may comprise a mixture of $N_2$ and $H_2$, a mixture of $NH_3$ and $H_2$, and a nitrogen-boron-hydrogen gas. In an embodiment, the reactive gas may comprise a mixture of $N_2$ and $H_2$ with a molar flow rate ratio of $N_2/H_2$ of approximately 1/1 to 10/1. In some embodiments the molar flow rate ratio of $N_2$ and $H_2$ is about 2/1 to about 4/1. In an embodiment, the reactive gas may comprise a mixture of $NH_3$ and $H_2$ with a molar flow rate ratio of $NH_3/H_2$ of approximately 1:1 to 1:10. In some embodiments the molar flow rate ratio of $NH_3/H_2$ is approximately 1:1 to 1:3.

In some embodiments, the rare gas may be one or more gasses selected from the group consisting of He, Ar, Kr, and Xe, and the molar flow rate of the rare gas may be greater than the molar flow rate of the deposition gas. In an embodiment, a flow rate of the rare gas introduced into the reaction chamber may be approximately 30 sccm to 3000 sccm. In some embodiments the flow rate of the rare gas is about 1500 sccm to about 2500 sccm. In an embodiment, the rare gas may comprise a mixture of helium and argon or a mixture of helium and krypton. In an embodiment, the rare gas may comprise a mixture of helium and argon with a molar flow rate ratio of helium/argon of approximately 3/1 to 20/1. In some embodiments the molar flow rate ratio of helium/argon is about 5/1 to about 15/1 In an embodiment, the rare gas comprises a mixture of helium and krypton with a molar flow rate ratio of helium/krypton of approximately 3/1 to 20/1. In some embodiments the molar flow rate ratio of helium/krypton is about 5/1 to about 15/1.

In some embodiments, only the three types of gas (i.e., the deposition gas, reactive gas, and rare gas) may be used, and no other gases such as a carbon precursor may be used.

In some embodiments, the film is a conformal dielectric film that may be a silicon nitride film.

Figure 7:
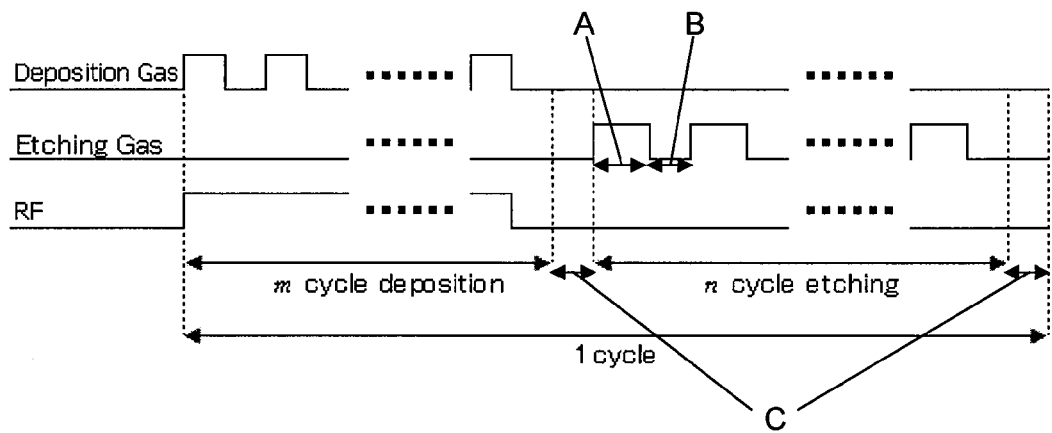
FIG. 7 shows a pulsed deposition sequence according to an embodiment of the present invention wherein purse steps are shown.

The next session is an etching session. Because the reactive gas and the rare gas are continuously introduced, a period between the deposition session and the etching session (first period C in FIG. 7) serves as a purge step (the period C may be in a range of 0.5 seconds to 5 seconds in some embodiments). Although FIG. 3 illustrates an embodiment wherein the deposition and the etching are conducted in the same reaction chamber, and purging is conducted therebetween, the deposition and the etching can be conducted in different reaction chambers, and during the period C, the substrate may be transferred to the next reaction chamber.

During the etching session, no deposition gas is introduced. The etching gas is introduced in pulses, In this figure, the pulse of etching gas is repeated n times, i.e., n cycles of etching gas are conducted during one etching session (one cycle of the pulse is defined in a similar manner to that of deposition gas in FIG, 2). The number n may be an integer of one to 10, typically 3 to 6 in some embodiments. RF power is applied also in pulses, Alternatively, RF power can be kept ON during the etching session In this figure, a rare gas flow is omitted, but it may be used and continuously introduced while the etching gas is introduced in pulses. Thus, a period (period B in FIG. 7) between two adjacent pulses (period A in FIG. 7) of etching gas serves as a purging step. Further, because the rare gas is continuously introduced, a period (second period C in FIG. 7) between the etching session and the deposition session serves as a purge step (the period C may be in a range of 0.5 seconds to 5 seconds in some embodiments).

The number of etching cycles (n) is selected based on the conformality of the film to be etched, because the top/side etching ratio is etching duration dependent. The shorter the etching duration or the higher the number of etching cycles (provided that the total etching duration is the same), the higher the top/side etching ratio becomes. In some embodiments, the top/side etching ratio may be manipulated in a range of from about one to about 5, typically from about 1.1 to about 2.5.

In some embodiments, the etching gas may be introduced in pulses of a duration of approximately 1 sec to 10 sec. In some embodiments, the pulses of the etching gas are of a duration of about 3 sec to about 6 sec. The shorter the duration, the higher the top/side etching ratio becomes, and thus, typically, the duration of the etching gas flow step may be less than 6 sec. In some embodiments, the pulses of the etching gas are separated by intervals (purging) of approximately 1 sec to 20 sec. In some embodiments the intervals are about 2 sec to about 10 sec or 3 sec to about 6 sec. In an embodiment, the pulse duration may be equal to or shorter than the interval.

In some embodiments, the etching gas may be selected from the group consisting of a gas containing $NF_3$, $C_2F_6$, and/or $C_3F_8$. In some embodiments, the RF power conditions may be the same as those during the deposition session.

In some embodiments, the reaction space pressure may be adjusted in the range of about 0.1 Torr to about 10 Torr, typically about 2 Torr to about 9 Torr.

In some embodiments, the substrate may be kept at a temperature of 0° C. to 400° C. while the film is etched. In some embodiments the substrate temperature is about 200° C. to about 400° C. during etching.

In some embodiments, the rare gas may be one or more gasses selected from the group consisting of He, Ar, Kr, and Xe, and the molar flow rate of the rare gas may be greater than the molar flow rate of the etching gas. In an embodiment, a flow rate of the rare gas introduced into the reaction chamber may be approximately 1,000 sccm to 5,000 sccm. In some embodiments the flow rate of the rare gas is about 2,000 sccm to about 4,000 sccm. In an embodiment, the rare gas may comprise a mixture of helium and argon or a mixture of helium and krypton.

In some embodiments, only the two types of gas (i.e., the etching gas and rare gas) may be used, and no other gases may be used.

A set of the deposition session and the etching session can be repeated multiple times until the target or desired conformality of the film with the target or desired thickness is obtained. In some embodiments, the number of cycles of the set may be 2 to 20, typically 3 to 10 so that the film with a conformality of more than 0.9 may have a thickness of 4 nm to 40 nm, typically 6 nm to 20 nm at the top surface.

Figure 4:
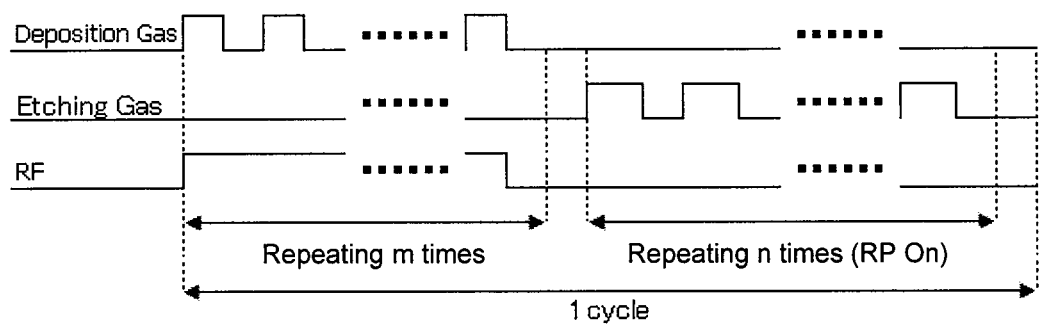
FIG. 4 shows a pulsed deposition sequence according to an embodiment of the present invention wherein remote plasma etching is conducted.

FIG. 4 illustrates another deposition sequence wherein RF power in the reaction chamber is OFF but excited etching gas is provided from a remote plasma unit outside the reaction chamber. The remote plasma unit may be kept ON while etching gas is provided in pulses. The etching conditions may be substantially similar to those shown in FIG. 3 except that the remote plasma power may be in a range of 0.1 kW to 3.0 kW, typically 0.3 kW to 2.0 kW.

In the present disclosure where conditions and/or structures are not specified, the skilled artisan in the art can readily provide such conditions and/or structures, in view of the present disclosure, as a matter of routine experimentation. Further, the PEALD disclosed in copending U.S. patent application Ser. Nos. 12/357,174, 12/553,759, 12/778,808, and 12/832,739, and U.S. Patent Provisional Application No. 61/251,526, and the pulsed PECVD disclosed in copending U.S. patent application Ser. No. 12/357,174 can be used in some embodiments, the disclosure of each of which is herein incorporated by reference in its entirety.

The present invention will be explained in detail with reference to specific examples which are not intended to limit the present invention. The numerical numbers applied in specific examples may be modified by a range of at least ±50%, wherein the endpoints of the ranges may be included or excluded.

EXAMPLES

Example 1

Figure 6:
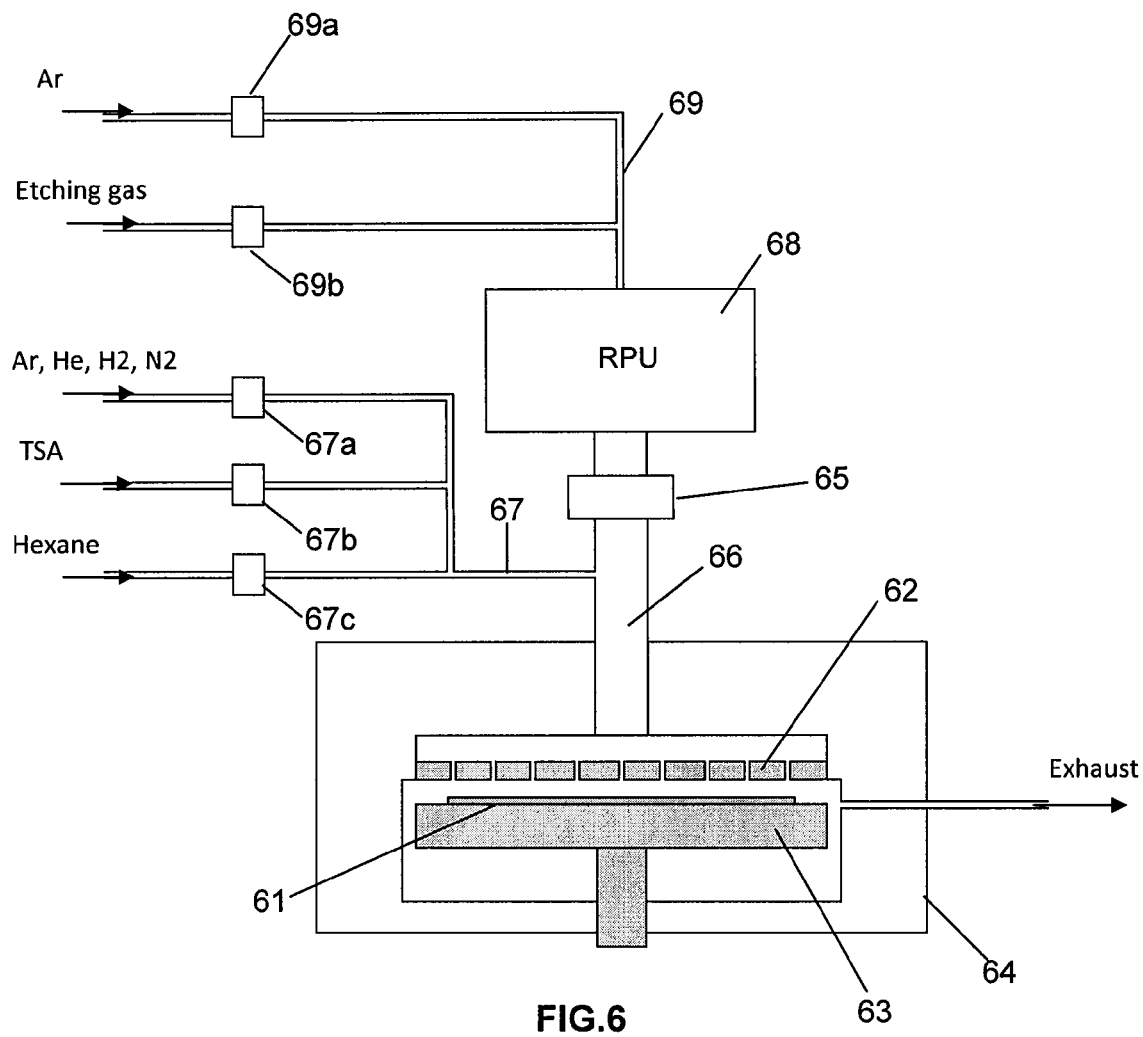
FIG. 6 is a schematic drawing showing a reactor used for deposition and etching according to an embodiment of the present invention.

A silicon nitride film was formed on a substrate having trenches under the conditions shown below using the sequence illustrated in FIG. 4 and the PEALD apparatus illustrated in FIG. 6. The trenches included relatively wide trenches (a width of 500 nm and a depth of 350 nm) and relatively narrow trenches (a width of 50 nm and a depth of 350 nm). Thus trenches of different aspect ratio were coated.

Deposition Session
Trisilyamin (TSA): 300 sccm
Hexane: 300 sccm
Hydrogen: 500 sccm
Nitrogen: 50 sccm
Argon: 1000 sccm
Helium: 1400 sccm
Substrate Temp.: 400° C.
RF power (a frequency of 13.56 MHz): 50 W (0.07 W/cm$^2$)
Pressure: 500 Pa
Deposition gas (TSA+hexane) supply time: 0.3 sec supply, 2 sec purge
Number of cycles in one session of deposition: 180
Etching Session (Remote Plasma)
Argon: 4000 sccm
NF3: 20 sccm
Pressure: 520 Pa
Etching gas supply time: 6 sec supply, 6 sec purge As illustrated in FIG. 6, a substrate 61 was placed on a susceptor 63 in an evacuateable reaction chamber 64. A shower plate 62 was disposed parallel to the susceptor 63. During the deposition session according to the sequence illustrated in FIG. 4, Ar, He, H2, and N2 were introduced into the reaction chamber 64 through a valve 67a, a line 67, a gas inlet port 66, and the shower plate 62. TSA was introduced in pulses into the reaction chamber 64 through a high-speed valve 67b, the line 67, the gas inlet port 66, and the shower plate 62. Hexane was introduced in pulses into the reaction chamber 64 through a high-speed valve 67c, the line 67, the gas inlet port 66, and the shower plate 62. The gas inside the reaction chamber 64 was discharged through an exhaust port. RF power from an RF power source (not shown) was applied to the shower plate 62, and the susceptor 63 was grounded (not shown). After the deposition session, etching was initiated (a purging period between the deposition and the etching was 25 second).

During the etching session, Ar was introduced into the reaction chamber 64 through a valve 69a, a line 69, a remote plasma unit 68, a valve 65, the gas inlet port 66, and the shower plate 62. The etching gas was also introduced into the reaction chamber 64 through a valve 69b, the line 69, the remote plasma unit 68, the valve 65, the gas inlet port 66, and the shower plate 62. The gas inside the reaction chamber 64 was discharged through an exhaust port. Since Ar was continuously introduced throughout the etching gas flow step and the purge step, the remote plasma would not be extinct. Although the remote plasma was continuously ON here, the remote plasma could be OFF during the purge step in other embodiments. The valve 67b was not a high-speed valve, and thus, the duration of the etching gas flow step could be set at 1 second to 5 minutes while the duration of the purge step could be set at 30 seconds to 5 minutes. Alternatively, the valve 67b could be replaced by a high-speed valve so that the durations of the etching gas flow step and the purge step could be set at a shorter period of time.

After the completion of the deposition and the etching, the trenches were observed with a scanning electron microscope and the thickness of the film was determined.

The top/side etching ratio (Top/Side) for 6-second etching time was 2.25 (2.7 nm/1.2 nm).

After the deposition, etching was conducted zero times, one time, and three times, and the thickness of the film at the top surface and that of the film at the side wall were determined. The results are shown in Table 1 below.

TABLE 1

| Deposition | | Etching Time and Cycle | |
|---|---|---|---|
| 180 cycle | N/A | 6 sec, 1 cycle | 6 sec, 3 cycle |
| Top Thickness | 10.2 nm | 7.5 nm | 2.1 nm |
| Side Thickness | 5.6 nm | 4.4 nm | 2.0 nm |
| Coverage | 55% | 59% | 95% |

It was confirmed that by repeating the etching step of 6 seconds three times, the step coverage (conformality) was improved from 55% to 95%.

A set of the deposition and the etching (6 seconds, 3 cycles) was repeated three times, and the target silicon nitride film having the following profiles was formed.

TABLE 2

| (Depo 160 cycle, Etch 3 cycle) × 3 cycle | |
|---|---|
| Top Thickness | 6.3 nm |
| Side Thickness | 6.0 nm |
| Coverage | 95% |

It was confirmed that by repeating the deposition and the etching, the coverage could be adjusted to 95% or higher. In the above, the cycle (for deposition, etching, and a set of deposition and etching) was repeated under the same conditions each time. However, in some embodiments, the cycle can be repeated using different conditions each time.

Example 2

Using the same apparatus and process conditions as in Example 1 except that the NF3 gas flow was 40 sccm, and the etching duration (etching gas flow step) was 3 seconds and 4 seconds, a film was formed. The top/side etching ratio was as follows:

TABLE 3

| | etching time | |
|---|---|---|
| | 3 sec | 4 sec |
| Top/Side etching ratio | 4.9 | 1.8 |

It was confirmed that the shorter the etching time, the higher the top/side etching ratio became. Thus, by adjusting the duration of etching, it is possible to obtain a film having high conformality.

Example 3

Using the same apparatus as in Example 1 except that NF3 gas was introduced without activating the remote plasma unit into the reaction chamber, and then was excited using RF power applied in the reaction chamber, a silicon nitride film was formed on a substrate. The etching conditions were as follows: Ar flow: 4000 sccm, NF3 flow: 5 to 50 sccm, and RF power: 20 to 100 W.

After the deposition, etching was conducted once for 6 seconds, 10 seconds, and 15 seconds. The top/side etching ratio was determined as follows:

TABLE 4

| | etching time | | |
|---|---|---|---|
| | 6 sec | 10 sec | 15 sec |
| Top/Side etching ratio | 2.25 (2.7 nm/1.2 nm) | 2 | 1.1 |

It was confirmed that the shorter the etching time, the higher the top/side etching ratio became. Thus, by adjusting the duration of etching, it is possible to obtain a film having high conformality.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a Si-containing film on a patterned surface of a substrate, comprising:
   (i) depositing a Si-containing sub-layer on the patterned surface by pulsed plasma enhanced chemical vapor deposition (PPECVD) or plasma enhanced atomic layer deposition (PEALD), wherein a thickness of the sub-layer is T1 at a top surface of the patterned surface, referred to as top thickness, and S1 at a side wall of the patterned surface, referred to as side thickness, wherein S1/T1 is less than one;
   (ii) etching the sub-layer by reducing T1 more than S1 to obtain a second top thickness T2 and a second side thickness S2, wherein S2/T2 is closer to one than is S1/T1, wherein the etching is conducted by pulsing: step (a) of exposing the sub-layer to an excited etching gas and step (b) of purging the excited etching gas therefrom while no excited etching gas is supplied, said excited etching gas being produced by a remote plasma unit and introduced in pulses into a reaction chamber where the substrate is placed, each pulse having a. duration of step (a) of 1 to 10 seconds and being separated by step (b) whose duration is equal to or longer than the duration of step (a); and
   (iii) repeating steps (i) and (ii) multiple times to increase the top thickness and the side thickness, thereby forming a Si-containing film composed of laminated multiple sub-layers on the patterned surface.

2. The method according to claim 1, wherein S1/T1 is less than 0.8, and S2/T2 is more than 0.9.

3. The method according to claim 1, wherein steps (i) and (ii) are conducted in the same reaction chamber.

4. The method according to claim 1, wherein steps (i) and (ii) are conducted in different reaction chambers.

5. The method according to claim 1, wherein Si-containing film is a SiN film or SiCN film.

6. The method according to claim 1, wherein each pulse in step (ii) has a duration of 6 seconds or less.

7. A method of tailoring conformality of a Si-containing film deposited by pulsed plasma enhanced chemical vapor deposition (PPECVD) or plasma enhanced atomic layer deposition (PEALD), comprising:

(i) setting a target conformality, S/T, of a target film deposited on a patterned surface of a substrate, where S denotes a thickness of the target film at a side wall of the patterned surface, and T denotes a thickness of the target film at a top surface of the patterned surface;

(ii) introducing during a first period a Si-containing deposition gas in pulses into a reaction area where the substrate with the patterned surface is placed, wherein a pulse of introducing the deposition gas is repeated multiple times, while no etching gas is introduced into the reaction area during the first period;

(iii) applying RF power to the reaction area at least when the deposition gas is not introduced during the first period, thereby depositing a film on the patterned surface of the substrate, wherein a thickness of the film is Ti at a top surface of the patterned surface and S1 at a side wall of the patterned surface;

(iv) discontinuing the introduction of the deposition gas and the application of RF power and exposing the film to excited etching gas during a second period, wherein the exposure of the excited etching gas to the film is conducted by pulsing: step (a) of exposing the film to the excited etching gas and step (b) of purging the excited etching gas therefrom while no excited etching gas is supplied during the second period said excited etching gas being introduced into the reaction area in pulses from a remote plasma unit, each pulse having a duration of step (a) of 1 to 10 seconds and being separated by step (b) whose duration is equal to or longer than the duration of step (a), wherein no Si-containing deposition gas is introduced during the second period, thereby reducing the thickness of the film to T2 at the top surface of the patterned surface and S2 at the side wall of the patterned surface, wherein S2/T2 is closer to 1than is S1/T1; and (v) if S2/T2 is not satisfactorily close to S/T, pulsing the exposure of the excited etching gas to the film, shortening a time period of each pulse, and increasing the number of pulses relative to those in immediately previous step (iv), followed by conducting steps (ii) to (iv).

8. The method according to claim 7, wherein S2/T2 is satisfactorily close to S/T in step (iv), and the method further comprises repeating steps (ii) to (iv) as a cycle until the target film is obtained.

9. The method according to claim 7, wherein the target film contains Si-N bonds.

10. The method according to claim 7, wherein in step (ii), a reactant gas and a rare gas are continuously introduced without interruption into the reaction area during the first period.

11. The method according to claim 7, wherein in step (iv), a rare gas is continuously introduced without interruption into the reaction area.

12. The method according to claim 7, wherein steps (ii) and (iv) are conducted in the same reaction chamber.

13. The method according to claim 7, wherein the first period and the second period are conducted in different reaction chambers.

14. The method according to claim 7., wherein each pulse in step (iv) has a duration of 6 seconds or less.

* * * * *